US008079002B1

(12) United States Patent
Lo et al.

(10) Patent No.: US 8,079,002 B1
(45) Date of Patent: Dec. 13, 2011

(54) METHOD AND APPARATUS FOR EVALUATING PATHS IN AN INTEGRATED CIRCUIT DESIGN

(75) Inventors: Kuok-Khian Lo, Milpitas, CA (US); Mark B. Roberts, Auburn, CA (US); Mohammed Fakhruddin, San Jose, CA (US); James Karp, Saratoga, CA (US); Richard P. Burnley, Mountain View, CA (US); Min-Hsing Chen, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 315 days.

(21) Appl. No.: 12/344,030

(22) Filed: Dec. 24, 2008

(51) Int. Cl.
*G06F 9/455* (2006.01)
*G06F 17/50* (2006.01)

(52) U.S. Cl. ........ 716/106; 716/102; 716/104; 716/116; 716/121

(58) Field of Classification Search .............. 716/5, 104, 716/121, 116, 102, 106
See application file for complete search history.

(56) References Cited

U.S. PATENT DOCUMENTS

| | | | |
|---|---|---|---|
| 6,115,546 A * | 9/2000 | Chevallier et al. | 716/112 |
| 6,553,542 B2 * | 4/2003 | Ramaswamy et al. | 716/112 |
| 2004/0243949 A1 * | 12/2004 | Wang et al. | 716/4 |
| 2006/0062155 A1 * | 3/2006 | Chen et al. | 370/250 |

OTHER PUBLICATIONS

U.S. Appl. No. 11/477,700, filed Jun. 29, 2006, Roberts, Mark B., Xilinx, Inc. 2100 Logic Drive, San Jose, CA 95124.

* cited by examiner

*Primary Examiner* — Nghia Doan
*Assistant Examiner* — Brian Ngo
(74) *Attorney, Agent, or Firm* — Murray Smith; LeRoy D. Maunu

(57) ABSTRACT

An embodiment of the invention involves: providing a database that includes layout information representing a layout within an integrated circuit of an electrical circuit; identifying from the information in the database each conductive path of a selected type in the electrical circuit; extracting layout information from the database for each conductive path of the selected type; and calculating an electrical parameter for each conductive path of the selected type, as a function of the layout information obtained for that conductive path during the extracting. In addition, in a different configuration of the embodiment, a report can be generated containing information based on the electrical parameter calculated during the calculating for at least one of the conductive paths of the selected type.

13 Claims, 3 Drawing Sheets

METHOD AND APPARATUS FOR EVALUATING PATHS IN AN INTEGRATED CIRCUIT DESIGN

FIELD OF THE INVENTION

The invention relates to integrated circuit devices (ICs). More particularly, the invention relates to techniques for protecting circuitry in an IC from electrostatic discharges.

BACKGROUND

There are a variety of different types of integrated circuits. One common type of integrated circuit is known as a programmable logic device (PLD), and can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

One danger to any type of IC, including the PLDs mentioned above, is potential damage from static electricity. More specifically, during physical handling of any IC before it is electrically coupled to and becomes part of a larger circuit, circuitry within the IC can potentially be damaged by static electricity carried by anything that happens to come into physical contact with one of the externally-accessible pads or terminals that are electrically coupled to the circuitry within the IC. For example, the human body can carry a charge of static electricity on the surface of the skin. If a finger happens to briefly touch one of the pads, static electricity on the skin could potentially cause a spike of current to flow into the IC through that pad, and that spike of electrostatic discharge (ESD) current could potentially burn out or otherwise damage part or all of the circuit within the IC.

In order to help protect an IC from damage due to ESD, it is known to supplement the main circuit in the IC with some special additional ESD circuitry that is specifically configured to absorb spikes of ESD current. However, for the ESD circuitry to be effective, electrically conductive paths between pads and the ESD circuit elements should have a very low resistance. Otherwise, when a spike of ESD current enters the IC through one of the pads, it will be less likely to travel from the pad to an ESD element, and more likely to travel to and damage the main circuit. Consequently, after an IC has been designed, and before it is actually fabricated, it is desirable to verify that, for each of the pads, a path from that pad to at least one ESD element has a path resistance below a specified value, such as 1 ohm ($\Omega$).

A pre-existing approach uses a manual direct current (DC) simulation. A person extracts an entire network or "net" from an IC design, and runs a DC simulation to determine the voltage drop from a pad to an ESD element. Then, by applying Ohm's law (V=IR), the resistance of that path can be determined. This manual evaluation has to be repeated for every ESD path in the IC. Although this pre-existing approach has been generally adequate for its intended purposes, it has not been entirely satisfactory in all respects, due in part to the fact that it is inherently very tedious and time consuming.

SUMMARY

One embodiment of the invention involves an apparatus having computer-readable storage that contains a database with layout information representing a layout within an integrated circuit of an electrical circuit; and that also contains computer-executable instructions. The instructions, when executed, cause: identifying from the information in the database each conductive path of a selected type in the electrical circuit; extracting layout information from the database for each conductive path of the selected type identified during the identifying; and calculating an electrical parameter for each conductive path of the selected type identified during the identifying, as a function of the layout information obtained for that conductive path during the extracting.

According to another embodiment of the invention, a method includes providing a database having layout information representing a layout within an integrated circuit of an electrical circuit, and carrying out a computer-implemented sequence that includes: identifying from the information in the database each conductive path of a selected type in the electrical circuit; extracting layout information from the database for each conductive path of the selected type identified during the identifying; calculating an electrical parameter for each conductive path of the selected type identified during the identifying, as a function of the layout information obtained for that conductive path during the extracting; and generating a report that includes information based on the electrical parameter calculated during the calculating for at least one of the conductive paths of the selected type.

According to yet another embodiment of the invention, a computer-based method to protect an integrated circuit includes employing a database that includes a first layout information regarding a layout of the integrated circuit. The method further includes identifying from the layout information in the database paths from pads to protection elements of the integrated circuit. In addition, the method includes extracting a second layout information from the first layout information for each of the paths, and also calculating an electrical characteristic for each of the paths using the extracted second layout information.

DETAILED DESCRIPTION

Figure 1:
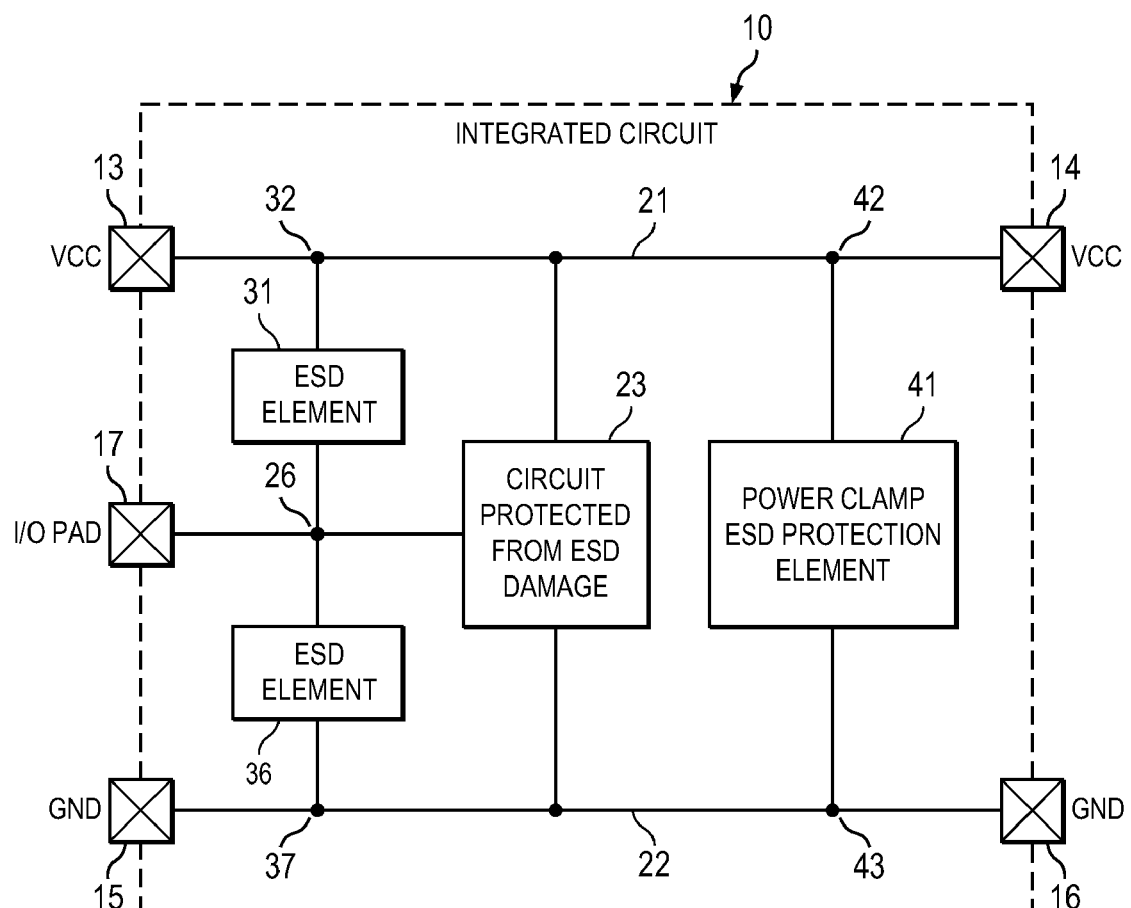
FIG. 1 is a block diagram of an integrated circuit (IC) that is a programmable logic device (PLD).

FIG. 1 is a block diagram of an integrated circuit (IC) 10. In the disclosed embodiment, the IC 10 is a type of IC known in the art, and in particular happens to be a programmable logic device (PLD) of the type discussed earlier. However, the IC 10 could alternatively be any of a variety of different types of ICs. FIG. 1 does not show all of the circuitry within the IC 10, but instead shows only selected portions that facilitate an understanding of the present invention.

The IC 10 includes a large number of conductive pads but, for simplicity and clarity, FIG. 1 shows only five of these pads, at 13-17. The pads 13-17 are each electrically conductive, and are each used to supply an electrical signal to or receive an electrical signal from the circuitry within the IC 10. The pads 13 and 14 are electrically coupled to a power supply network or "net" 21 that is provided within the IC 10, and are each used to supply a direct current (DC) voltage VCC to circuitry within the IC. The pads 15 and 16 are each electrically coupled to a ground network or net 22 provided with the IC 10.

The IC 10 includes a circuit that is shown diagrammatically at 23. In the disclosed embodiment, the circuit 23 is a PLD of the type discussed earlier, but the circuit 23 could alternatively be any of a variety of other types of circuits that perform various types of functions. The particular function performed by the circuit 23 is not necessary to an understanding of the present invention, and the circuit is therefore not illustrated and described here in detail. The circuit 23 is electrically coupled though a node 26 to the pad 17. The pad 17 is an input/output (I/O) pad. The pad 17 could be used for input, or in other words to supply an electrical signal from externally of the IC 10 to the circuit 23 inside the IC. Alternatively, the pad 17 could be used for output, or in other words to supply an electrical signal from the circuit 23 to a not-illustrated circuit external to the IC. As still another alternative, the circuit 23 in the IC 10 could be capable of using the pad 17 for both input and output.

During physical handling of the IC 10, for example before the IC is electrically coupled to and becomes part of a larger circuit, the circuit 23 could potentially be damaged by static electricity carried by anything that happens to come into physical contact with one of the pads 13-17. For example, the human body can carry a charge of static electricity on the surface of the skin. If a finger happens to briefly touch one of the pads 13-17, static electricity on the skin could potentially cause a spike of current to flow into the IC 10 through the pad that was touched, and such a current spike from electrostatic discharge (ESD) could potentially burn out or otherwise damage part or all of the circuit 23. Therefore, in order to help protect the circuit 23 from damage due to ESD, the IC 10 has extra circuitry provided specifically to protect the circuit 23 from damage due to ESD.

For example, the IC 10 includes an ESD element 31 that is electrically coupled to the node 26, and also to a node 32 that is part of the power supply network 21. The IC 10 includes another ESD element 36 that is coupled to the node 26, and also to a node 37 that is part of the ground network 22. Further, the IC 10 includes a power clamp ESD protection element 41 coupled to a node 42 that is part of the power supply network 21, and a node 43 that is part of the ground network 22. As a practical matter, the IC 10 would typically have a large number of ESD elements, but for simplicity and clarity, only three ESD elements 31, 36 and 41 are actually depicted in FIG. 1.

For the ESD elements 31, 36 and 41 to operate properly and effectively, and thereby protect the circuit 23 from damage due to ESD, the electrical path from each pad 13-17 to one of the ESD elements 31, 36 or 41 should have a very low resistance, for example less than 1 ohm ($\Omega$). Otherwise, a spike of ESD current that enters the IC through one of the pads 13-17 will be less likely to travel from the pad to one of the ESD elements 31, 36 and 41, and instead will be likely to travel to the circuit 23 and damage a portion of it. Consequently, after the IC 10 has been designed, and before it is actually fabricated, it is desirable to verify that, for each of the pads 13-17, at least one path from that pad to one of the ESD elements 31, 36 and 41 has a resistance below a specified maximum or threshold resistance, such as 1$\Omega$.

In the simplified block diagram of FIG. 1, there are six paths of interest. The first path runs from the pad 13 through the node 32 to the ESD element 31. The second path runs from the pad 17 through the node 26 to the ESD element 31. The third path runs from the pad 17 through the node 26 to the ESD element 36. The fourth path runs from the pad 15 through the node 37 to the ESD element 36. The fifth path runs from the pad 14 through the node 42 to the ESD element 41. The sixth path runs from the pad 16 through the node 43 to the ESD element 41. It should be noted that each of these six paths is a portion of a larger network or net. For example, the path from the pad 13 through the node 32 to the ESD element 31 is a portion of the overall power supply network or net 21, where the net 21 in FIG. 1 is electrically coupled to the pad 13, the ESD element 31, the circuit 23, the ESD element 41 and the pad 14. The six paths identified above in FIG. 1 should each have a maximum resistance that is less than a specified maximum or threshold, such as 1$\Omega$. One aspect of the present invention is a technique for efficiently identifying the paths that provide ESD protection, and then calculating the resistance that each such path would have if it were actually implemented in an integrated circuit, at a point in time before the integrated circuit design is actually fabricated.

Figure 2:
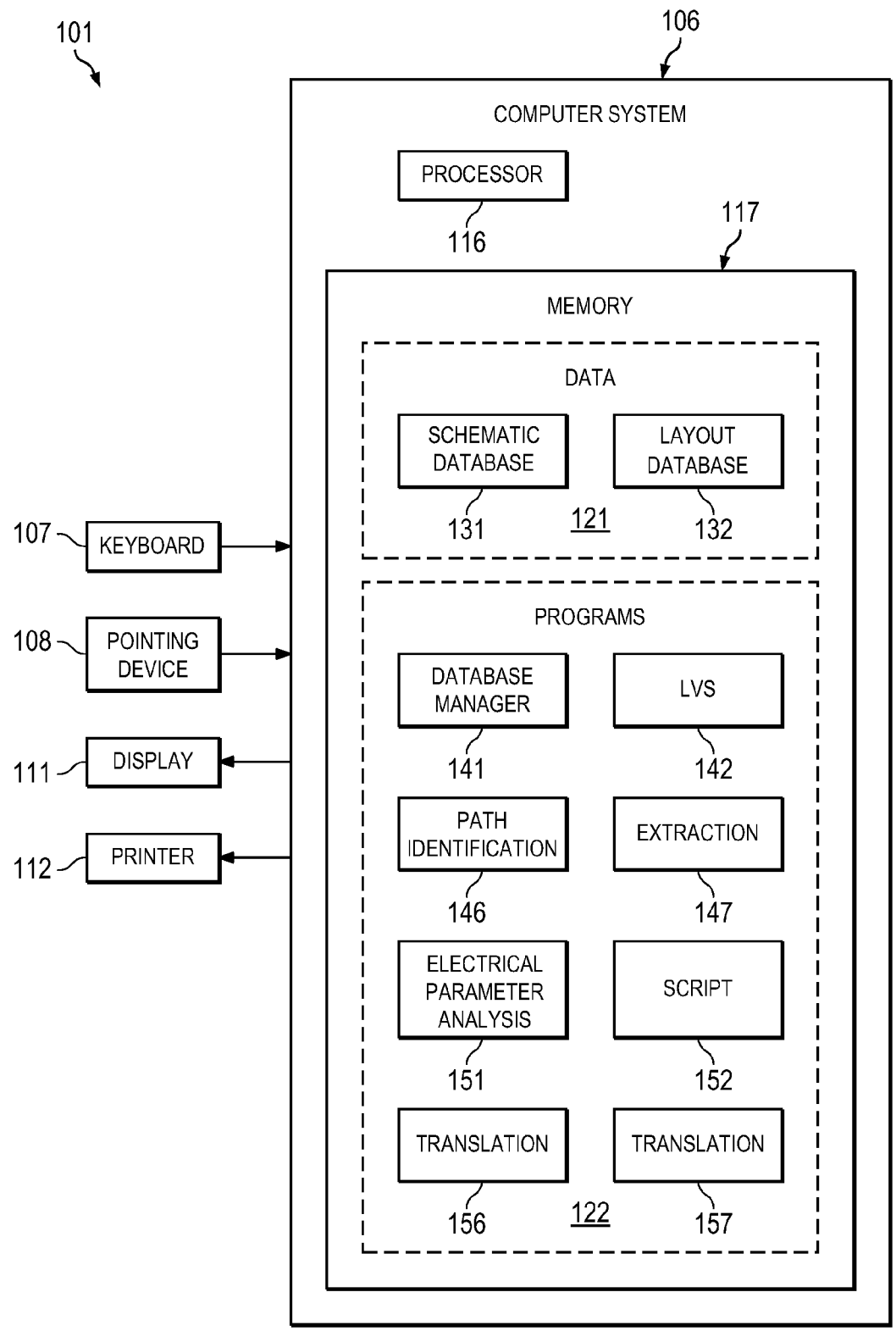
FIG. 2 is a diagrammatic view of a computer system that embodies aspects of the present invention, and that can be used to analyze certain characteristics of a circuit within an IC, such as the IC shown in FIG. 1.

FIG. 2 is a diagrammatic view of a computer system 101 that embodies aspects of the present invention. In this regard, the computer system 101 can be used to identify ESD protection paths in an IC design, and calculate the resistance of each such path. In the disclosed embodiment, the computer system 101 includes computer hardware in the form of a conventional, commercially-available computer of the type commonly known as a personal computer. In the disclosed embodiment, the hardware of the computer system 101 is a standard personal computer obtained commercially from Dell, Inc. of Round Rock, Tex. Alternatively, however, the hardware of the computer system 101 could be any other suitable hardware. The computer system 101 includes a main unit 106 that is electrically coupled through respective electrical cables to two input devices 107 and 108, and two output devices 111 and 112. The input device 107 is a standard computer keyboard, and the input device 108 is a standard pointing device, such as a mouse or trackball. The output device 111 is a standard display or monitor, and the output device 112 is a standard printer.

The main unit 106 includes a processor 116, which may be any suitable processor or microprocessor. As one example, the processor may be a device that is available commercially under the tradename Core™ 2 Duo from Intel Corporation of Santa Clara, Calif. The main unit 106 has a memory 117. The memory 117 is shown diagrammatically in FIG. 2, and represents several different types of memory that happen to be present within the main unit 106 of the computer system 101. For example, the memory 117 may include any or all of a hard disc drive, a volatile random access memory (RAM), a "flash" RAM, a read only memory (ROM), or any other type of memory component suitable for use within the main unit 106. The memory 117 stores data 121, and also programs 122 that can be executed by the processor 116. FIG. 2 shows some examples of the data 121 stored within the memory 117, and some examples of the programs 122 stored within the memory 117. However, FIG. 2 is not intended to show all data or all programs that are stored within the memory 117. FIG. 2 shows only selected data elements and selected programs that facilitate an understanding of an embodiment of the present invention.

In more detail, the data 121 in the memory 117 includes a schematic database 131, and a layout database 132. The databases 131 and 132 may each include a plurality of files but, for clarity, each is represented in FIG. 2 by a single rectangular block. The databases 131 and 132 each store data in a respective format that is very well known in the art, but each database could alternatively use any other suitable format. The schematic database 131 is an electronic representation of a circuit schematic. For the sake of this discussion, it is assumed that the database 131 is an electronic representation of all of the circuitry within the IC 10 of FIG. 1. This includes an identification of each of the electronic components within that circuit, an identification of the characteristics of each such component (such as the resistance of each resistor, capacitance of the each capacitor, and so forth), and an identification of each electrically conductive pad. In addition, the schematic database 131 identifies how all of the identified electronic components and conductive pads are interconnected, or in other words includes a definition of each of the electrically conductive networks or nets that electrically couple the pads and components.

The layout database 132 relates to the same circuit as the schematic database 131, but contains a definition of how to actually implement that circuit within an IC. For example, the layout database 132 identifies all of the electronic components and conductive pads, indicates where each would be physically located within an integrated circuit, indicates how each would be fabricated within the integrated circuit, and indicates how various electrically conductive networks or nets would be physically structured within the IC in order to electrically couple the components and pads.

Turning to the executable programs 122, a database manager program 141 of a known type is provided, and is used to create and manage both the schematic database 131 and the layout database 132. In the disclosed embodiment, the database manager 141 is a program that is commercially available under the trademark Virtuoso® from Cadence Design Systems, Inc. of San Jose, Calif. However, it would alternatively be possible to use any other suitable database manager program. Another of the executable programs 122 is a "layout versus schematic" (LVS) program 142. The LVS program 142 is a known type of program that can compare the schematic database 131 to the corresponding layout database 132, and identify any inconsistencies between them. If the LVS program detects an inconsistency between the two databases, it can identify the particular path that is subject to the inconsistency. In the disclosed embodiment, the LVS program 142 is a program that is obtained commercially under the trademark Calibre® from Mentor Graphics Corporation of Wilsonville, Oreg.

Another of the executable programs 122 is a path identification program 146. The path identification program 146 can take the schematic database 131, identify networks or nets therein, and also perform electrical rule checks (ERCs) on the design of the circuit represented by the schematic database 131. As one example of an ERC, the program 146 may check to see whether any two output pads happen to be shorted together, even though they should not be. If there is a violation of an ERC, the path identification program 146 can identify the particular path that involves the violation. In the disclosed embodiment, the path identification program 146 is a slightly modified version of a program that is disclosed in U.S. Ser. No. 11/477,700 filed Jun. 29, 2006, the disclosure of which is hereby incorporated herein by reference. However, other embodiments of the invention can employ a different program to identify paths. In particular, the path identification program 146 has the capability to locate and identify certain specific types of paths, which are the specific types of ESD paths discussed above in association with FIG. 1. In effect, the program performs an ERC that identifies certain specific types of paths, without requiring that those paths include any error.

The executable programs 122 in the memory 117 also include an extraction program 147. The extraction program 147 can take layout information from the layout database 132, and extract layout information for one or more specified networks or nets. In the disclosed embodiment, the extraction program is a program obtained commercially under the tradename Star-RCXT™ from Synopsys, Inc. of Mountain View, Calif. However, other embodiments of the invention can employ a different program to extract layout information. Another of the executable programs 122 in the memory 117 is an electrical parameter analysis program 151, which can take layout information for a given network or net, and calculate an electrical parameter associated with all or a specified portion of that net. In the disclosed embodiment, the electrical parameter analysis program is a program obtained commercially under the tradename HSIMplus™ SPRES from Synopsys, Inc. However, other embodiments of the invention can employ a different program to perform electrical parameter analysis. As one example, the electrical parameter analysis program 151 can calculate the electrical resistance between two specified points within a given network or net, taking into account the specific layout configuration that the net would have if implemented within an IC according to the particular layout specified by the layout database 132.

Another of the executable programs 122 within the memory 117 is an optional script 152, which is discussed in more detail later. The executable programs 122 further include two translation programs 156 and 157. The translation program 156 takes output information from the path identification program 146, and converts it from a format used by the path identification program 146 to a format accepted as input by the electrical parameter analysis program 151. Similarly, the translation program 157 takes the same output information from the path identification program 146, and converts it from the format used by the path identification program 146 to a different format that will be accepted as input by the extraction program 147. Persons skilled in the art are familiar with translation programs of the type shown at 156 and 157, and these programs are therefore not illustrated and described here in detail.

Figure 3:
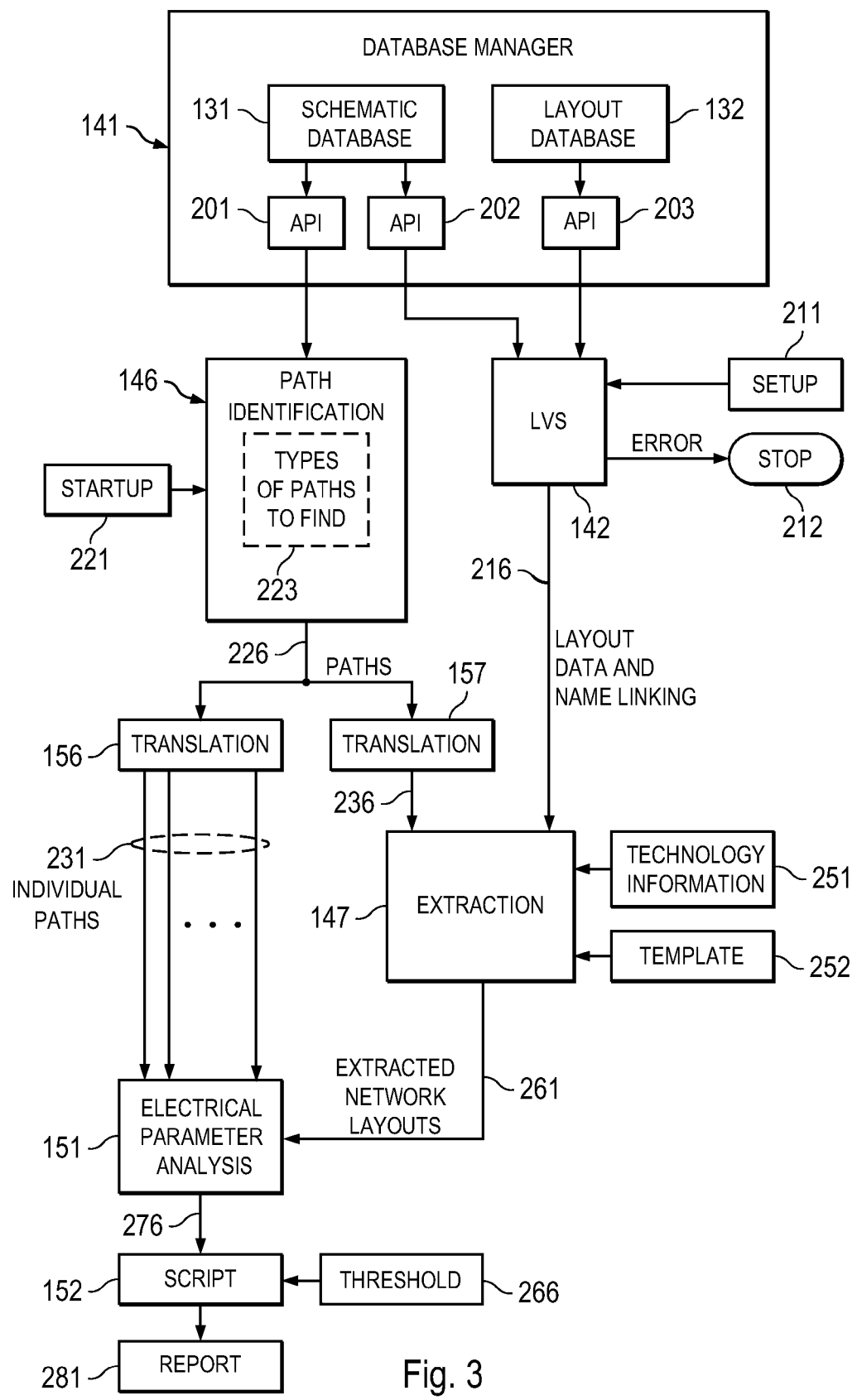
FIG. 3 is a diagram showing an embodiment of a flow of data processing through several different computer programs

FIG. 3 is a diagram showing an embodiment of a flow of data processing through the various computer programs depicted at 122 in FIG. 2. At the top of FIG. 3 is the database manager program 141. As discussed above, the database manager program 141 is used to create and manage both the schematic database 131 and also the layout database 132, which are both shown with the database manager 141 in FIG. 3. The database manager 141 includes three application program interfaces (APIs) 201, 202 and 203. The API 201 outputs information from the schematic database 131 in a format that will be accepted as input by the path identification program 146, the API 202 outputs information from the schematic database 131 in a format that will be accepted as input by the LVS program 142, and the API 203 outputs information from the layout database 132 in a format that will be accepted as input by the LVS program 142.

The LVS program 142 is provided with some setup or configuration information 211. Persons skilled in the art are thoroughly familiar with the setup information needed by the LVS program 142, and the setup information shown at 211 is thus very standard, and not described here in detail. Once the setup information 211 has been created, it does not normally change. As noted earlier, the LVS program 142 compares (1) the circuit as defined by information in the schematic database 131 with (2) the circuit as defined by information in the layout database 132. In theory, at the circuit schematic level, the layout database 132 should be defining identically the same circuit as the schematic database 131. But as a practical matter, if inadvertent errors had been made during the design of the layout for the integrated circuit, the circuit as defined by the layout database 132 may have some minor differences from the circuit as defined by the schematic database 131.

If the LVS program 142 detects any type of discrepancy between the two databases 131 and 132, it flags an error, and the data flow shown in FIG. 3 stops at 212. The discrepancy can then be resolved by modifying the layout database 132 and/or schematic database 131. After any necessary modifications have been made, the data flow shown in FIG. 3 is restarted from the beginning. In particular, the LVS program 142 will be run again using the modified database(s). If the LVS program 142 does not detect any discrepancy between the two databases, then the LVS program 142 provides output at 216 that includes (1) layout data from the layout database 132, and (2) name linking information. The name linking information correlates names used in the schematic database 131 to names used in the layout database 132, because the two databases may possibly use different names to refer to the same thing.

Turning to the path identification program 146, startup or configuration information 221 is provided to the program 146. Persons skilled in the art are familiar with the type of startup information 221 needed by the path identification program 146. Once the startup information 221 has been created, it does not normally change. Therefore, the startup information 221 is not described here in detail, but instead is discussed only briefly. More specifically, the startup or configuration information 221 includes, for example, (1) information about parameters such as the voltage levels used in the circuit represented by databases 131 and 132, and (2) information specifying which of several possible functions the path identification program 146 should carry out. In regard to the latter, the path identification program 146 includes a section 223 having instructions that can analyze information from the schematic database 131 in order to identify the specific types of ESD paths discussed above in association with FIG. 1. Thus, for purposes of the particular data flow shown in FIG. 3, the startup information 221 includes an indication to the path identification program 146 that it should use the program section 223 to find ESD paths in the circuit defined by the schematic database 131. The path identification program 146 carries out this analysis, and then outputs information 226 identifying each path in the circuit that can be considered an ESD path. This information is provided to each of the translation programs 156 and 157.

The translation program 156 takes the set of paths identified at 226 and effectually breaks this set up into individual paths, which are then supplied in succession to the electrical parameter analysis program 151, as shown diagrammatically at 231. The translation program 157 takes the set of paths identified at 226, and converts this information from the format produced by the path identification program 146 to a format that will be accepted as input by the extraction program 147.

The extraction program 147 is provided with technology information 251, which is information about the integrated circuit fabrication technology used to create the particular layout embodied in the layout database 132. More specifically, this includes information such as the type of metal used to create electrically conductive interconnection networks within the layout, the widths and cross-sectional sizes of conductive interconnections, resistance information for the material of the conductive interconnections, and so forth. Persons skilled in the art are thoroughly familiar with the type of information that must be supplied at 251 to the extraction program 147 for any given technology and, once the technology information 251 has been prepared for a given technology, it does not normally change. The technology information is therefore not described here in detail.

The extraction program 147 is also provided with a template 252. The template 252 provides the extraction program 147 with the settings that tell it to do selective extraction of the networks of interest. Persons skilled in the art who are familiar with the extraction program 147 can readily generate a template file 252 that provides the extraction program with the settings that will cause it to do selective extraction and, once the template 252 has been created, it does not normally change. The template 252 is therefore not described here in detail.

As explained earlier, the extraction program 147 receives at 236 a list of paths that constitute ESD paths within the circuit defined by the databases 131 and 132. Using the name linking information received at 216, the extraction program 147 can correlate the paths identified at 236 to specific networks within the layout data received at 216. The extraction program 147 can take the layout data received at 216 for the entire integrated circuit, and extract from it a subset of layout information that is the layout data for each of the specific networks identified by the information at 236. The extraction program outputs at 261 extracted layout information for each the networks of interest.

As discussed earlier, the translation program 156 takes the set of paths identified at 226, and splits them up into separate paths that are supplied in succession at 231 to the electrical parameter analysis program 151. As the electrical parameter analysis program receives each of these individual paths at 231, it identifies the corresponding network in the extracted layout information received at 261, identifies the portion of that network corresponding to the indicated path, and then calculates the resistance of that path. In this regard, as discussed above in association with FIG. 1, a given ESD path is not necessarily an entire network, and in fact a network may contain two or more ESD paths of interest. For example, the network 21 in FIG. 1 includes one ESD path running from pad 13 through node 32 to ESD element 31, and also includes a further ESD path running from pad 14 through node 42 to ESD element 41. The electrical parameter analysis program 151 would thus calculate the resistance along the path running from pad 13 through node 32 to ESD element 31, and also the resistance along the path running from pad 14 through node 42 to ESD element 41. The electrical parameter analysis program 151 outputs at 276 to the script program 152 a list of all the paths identified at 231, and the resistance that it calculated for each such path.

As discussed above in association with FIG. 1, each of the ESD paths should have a resistance no greater than a specified maximum resistance, for example 1Ω. The script program 152 is provided at 266 with a threshold value that, in the disclosed embodiment, is the maximum permissible resistance for ESD paths. This threshold is a selected one of two or more values, for example a selected one of 1Ω or 5Ω. In the disclosed embodiment, the threshold 266 specifies a resistance of 1Ω, but it could alternatively specify a resistance of 5Ω or some other suitable value.

For each ESD path identified at 231, the script program 152 compares the calculated resistance for that path to the threshold resistance specified at 266. Thus, in the disclosed embodiment, the script program 152 determines whether the calculated resistance for any ESD path is greater than the threshold resistance of 1Ω. The script program 152 compiles a list of all ESD paths (if any) that have a resistance exceeding the specified threshold, and outputs this list in the form of a report 281 that can be sent to and printed on paper by the printer 112 (FIG. 2). If the report 281 identifies any ESD path having a resistance above the specified threshold 266, a design engineer will take the report and use the information in it to reconfigure portions of the layout design in the layout database 132, so as to reduce the resistance of each ESD path identified in the report. After the design changes have been implemented in the layout database 132, the dataflow shown in FIG. 3 will be repeated from the beginning, in order to verify that all ESD paths in the modified layout have a resistance below the threshold specified at 266.

As noted earlier, the script program 152 is optional. If the script program 152 is omitted, then the list produced at 276 will serve as the report 281 that can be sent to the printer 112. In that case, the printed report would simply list all of the paths identified at 231, along with the resistance calculated for each such path. A person would then manually compare each of those resistances to appropriate threshold resistance (such as 1Ω or 5Ω) in order to determine which paths had a resistance that was too high. If the person determined that any ESD path had a resistance above the threshold, then as noted above a design engineer would reconfigure portions of the layout design in the layout database 132, so as to reduce the resistance of each ESD path having an excessive resistance. After implementation of these design changes in the layout database 132, the dataflow shown in FIG. 3 would be repeated from the beginning, in order to verify that all ESD paths in the modified layout have a resistance below the threshold resistance.

Still referring to FIG. 3, it is possible for a person using the keyboard 107 (FIG. 1), the pointing device 108, and the display 111 to manually start the LVS program 142, and identify the specific related databases 131 and 132 that are to be analyzed. Then, if the LVS program 142 concludes without identifying any error 212, the person can thereafter manually start the path identification program 146, again identifying the specific schematic database 131 that it should use. After the path identification program 146 concludes its operation, the person can manually use the translation programs 156 and 157 to adjust the output file or files produced at 226 by the path identification program 146. Then, the user can manually start the extraction program 147, identifying the files 236 and 216 that the extraction program should use as input. After the extraction program has finished its operation, the person can then manually start the electrical parameter analysis program 151, and identify the files 231 and 261 that it should use as input. Finally, if the optional script program 152 is present, the user would manually start the script program in order to adjust the output 276 of the program 151 before it is printed as a report 281.

As an alternative, it would be possible to optionally provide a graphical user interface (GUI) for one or more of the programs depicted in FIG. 3, in order to provide a more user-friendly interface between a user and each such program. Further, the translation program 156 could be optionally integrated into a GUI for either the program 146 or the program 151, and the translation program 157 could optionally be integrated into a GUI for either the program 146 or the program 147. Further, the script program 152, if present, could optionally be integrated into a GUI for the program 151.

As yet another alternative, it would be possible to provide a not-illustrated job control program that would effectively automate the entire process shown in FIG. 3. A user would start the job control program and specify the schematic and layout databases 131 and 132 of interest. The job control program would then automatically start each of the programs 142, 146, 156, 157, 147, 151 and 152 in the appropriate sequence, without further involvement by the user. If the LVS program 142 happened to detect an error at 212, then the job control program would stop the process at that point. Otherwise, upon completion of the flow shown in FIG. 3, the job control program would send the report 281 to the printer 112 (FIG. 2).

As explained above, the disclosed embodiment determines an electrical characteristic that happens to be a path resistance. However, instead of resistance, it would alternatively be possible to determine some other electrical characteristic, for example capacitance or inductance.

In the disclosed embodiment, a single disclosed computer system 101 contains all of the relevant data 121, and has a processor 116 that executes all of the relevant programs 122. However, it would alternatively be possible for portions of the data 121 to be maintained in two or more different computer systems, and for subsets of the programs 122 to be executed by different processors in two or more different computer systems.

Although a selected embodiment has been illustrated and described in detail, it should be understood that a variety of substitutions and alterations are possible without departing from the spirit and scope of the present invention, as defined by the claims that follow.

What is claimed is:
1. An apparatus comprising:
computer-readable storage containing:
  a database that includes layout information representing a layout within an integrated circuit of an electrical circuit, the integrated circuit having external pads and electro-static discharge (ESD) elements;
  wherein the database has a first section containing schematic information representing a circuit schematic for the electrical circuit and a second section containing the layout information for the electrical circuit; and
  computer-executable instructions that, when executed, cause:
    identifying from the schematic information in the database, conductive paths from the external pads of the integrated circuit to the electro-static discharge (ESD) elements in the electrical circuit;
    extracting layout information describing the electrical circuit from the layout information in the database;
    for each conductive path identified from the schematic information, identifying a corresponding network and a corresponding portion of the network in the extracted layout information;

calculating an associated resistance for each conductive path as a function of the layout information of the identified corresponding portion of the network for that conductive path;

determining whether the associated resistance of each conductive path exceeds a threshold; and outputting data indicative of each conductive path having the associated resistance determined to exceed the threshold.

2. An apparatus according to claim 1, wherein the computer-executable instructions, when executed, further cause generating of a report that includes information based on the associated resistance calculated during the calculating for at least one of the conductive paths.

3. An apparatus according to claim 1,
wherein the computer-executable instructions, when executed, further cause comparing of the first and second sections of the database to identify any discrepancies therebetween.

4. The apparatus of claim 1, wherein the schematic information includes identification the external pads.

5. The apparatus of claim 1, wherein the identifying a corresponding network and a corresponding portion of the network in the extracted layout information for each conductive path includes, for two or more of the identified conductive paths, identifying respective corresponding portions of one corresponding network.

6. A method comprising:
providing a database that includes layout information representing a layout within an integrated circuit of an electrical circuit, the integrated circuit having external pads and electro-static discharge (ESD) elements;
wherein the database has a first section containing schematic information representing a circuit schematic for the electrical circuit and a second section containing the layout information for the electrical circuit; and
carrying out a sequence that includes:
identifying from the schematic information in the database, conductive paths from the external pads of the integrated circuit to the electro-static discharge (ESD) elements in the electrical circuit;
extracting layout information describing the electrical circuit from the layout information in the database;
for each conductive path identified from the schematic information, identifying a corresponding network and a corresponding portion of the network in the extracted layout information;
calculating, using a computer system, an associated respective resistance for each conductive path as a function of the layout information of the identified corresponding portion of the network for that conductive path;

determining whether the respective resistance of each conductive path exceeds a maximum resistance value; and generating a report that includes information indicative of each conductive path having the respective resistance determined to exceed the maximum resistance value.

7. A method according to claim 6, including comparing the first and second sections of the database to identify any discrepancies therebetween.

8. The method of claim 6, wherein the schematic information includes identification the external pads.

9. The method of claim 6, wherein the identifying a corresponding network and a corresponding portion of the network in the extracted layout information for each conductive path includes, for two or more of the identified conductive paths, identifying respective corresponding portions of one corresponding network.

10. A method to protect an integrated circuit by employing a database that includes schematic information representing a circuit schematic for the integrated circuit and layout information regarding a layout of the integrated circuit, the integrated circuit having external pads and electro-static discharge (ESD) elements, the method comprising:
identifying from the schematic information in the database, a plurality of paths from a plurality of external pads to a plurality of electro-static discharge (ESD) protection elements of the integrated circuit;
extracting layout information describing the integrated circuit from the layout information in the database; and
for each path identified from the schematic information, identifying a corresponding network and a corresponding portion of the network in the extracted layout information;
calculating, using a computer system, an associated resistance for each of the plurality of paths using the layout information of the identified corresponding portion of the network;
determining whether the associated resistance of each conductive path exceeds a threshold; and
outputting data indicative of each conductive path having the associated resistance determined to exceed the threshold.

11. A method according to claim 10, including comparing the schematic information and layout information to identify any discrepancies therebetween.

12. The method of claim 10, wherein the schematic information includes identification the external pads.

13. The method of claim 10, wherein the identifying a corresponding network and a corresponding portion of the network in the extracted layout information for each conductive path includes, for two or more of the identified conductive paths, identifying respective corresponding portions of one corresponding network.

* * * * *